(12) United States Patent
Varghese et al.

(10) Patent No.: US 12,217,974 B2
(45) Date of Patent: Feb. 4, 2025

(54) LOCALIZED STRESS MODULATION BY IMPLANT TO BACK OF WAFER

(71) Applicant: Applied Materials, Inc., Santa Clara, CA (US)

(72) Inventors: Sony Varghese, Manchester, MA (US); Pradeep Subrahmanyan, Cupertino, CA (US); Dennis Rodier, Francestown, NH (US); Kyuha Shim, Andover, MA (US)

(73) Assignee: Applied Materials, Inc., Santa Clara, CA (US)

( * ) Notice: Subject to any disclaimer, the term of this patent is extended or adjusted under 35 U.S.C. 154(b) by 590 days.

(21) Appl. No.: 17/396,101

(22) Filed: Aug. 6, 2021

(65) Prior Publication Data

US 2022/0344171 A1   Oct. 27, 2022

Related U.S. Application Data

(60) Provisional application No. 63/179,944, filed on Apr. 26, 2021.

(51) Int. Cl.
  *H01L 21/3115*   (2006.01)
  *H01J 37/147*   (2006.01)
  (Continued)

(52) U.S. Cl.
  CPC .... *H01L 21/31155* (2013.01); *H01J 37/1474* (2013.01); *H01J 37/304* (2013.01);
  (Continued)

(58) Field of Classification Search
  None
  See application file for complete search history.

(56) References Cited

U.S. PATENT DOCUMENTS 7,223,676 B2   5/2007   Hanawa et al.
7,592,270 B2   9/2009   Teo et al.
        (Continued)

FOREIGN PATENT DOCUMENTS

JP   5643509 B2   12/1899

OTHER PUBLICATIONS

International Search Report and Written Opinion dated Jul. 27, 2022, for the International Patent Application No. PCT/US2022/023525, filed on Apr. 5, 2022, 7 pages.

*Primary Examiner* — Michelle Mandala
(74) *Attorney, Agent, or Firm* — KDW FIRM PLLC (57) ABSTRACT

Embodiments herein are directed to localized stress modulation by implanting a first side of a substrate to reduce in-plane distortion along a second side of the substrate. In some embodiments, a method may include providing a substrate, the substrate comprising a first main side opposite a second main side, wherein a plurality of features are disposed on the first main side, performing a metrology scan to the first main side to determine an amount of distortion to the substrate due to the formation of the plurality of features, and depositing a stress compensation film along the second main side of the substrate, wherein a stress and a thickness of the stress compensation film is determined based on the amount of distortion to the substrate. The method may further include directing ions to the stress compensation film in an ion implant procedure.

14 Claims, 8 Drawing Sheets

(51) Int. Cl.
*H01J 37/304* (2006.01)
*H01J 37/317* (2006.01)
*H01L 21/66* (2006.01)

(52) U.S. Cl.
CPC .......... *H01J 37/3171* (2013.01); *H01L 22/12* (2013.01); *H01J 2237/24585* (2013.01)

(56) References Cited

U.S. PATENT DOCUMENTS

| | | |
|---|---|---|
| 7,727,856 B2 | 6/2010 | Teo et al. |
| 8,124,487 B2 | 2/2012 | Maynard et al. |
| 8,617,955 B2 | 12/2013 | Waite |
| 9,412,613 B2 | 8/2016 | Manna et al. |
| 10,515,802 B2 | 12/2019 | Prasad et al. |
| 10,811,257 B2 | 10/2020 | Prasad et al. |
| 2012/0280355 A1 | 11/2012 | Akiyama et al. |
| 2014/0273461 A1 | 9/2014 | Lee et al. |
| 2015/0311380 A1* | 10/2015 | Solari ............... H01L 33/007 438/46 |
| 2015/0371908 A1 | 12/2015 | Bencher et al. |
| 2016/0079034 A1 | 3/2016 | Yieh et al. |
| 2017/0176654 A1* | 6/2017 | Sawyer ............... G02B 5/0858 |
| 2017/0316987 A1 | 11/2017 | Yu et al. |
| 2018/0068861 A1* | 3/2018 | deVilliers ........... H01L 21/6875 |
| 2020/0058509 A1 | 2/2020 | deVilliers |
| 2020/0091092 A1 | 3/2020 | Ito et al. |
| 2020/0118822 A1 | 4/2020 | Falk et al. |
| 2021/0050411 A1 | 2/2021 | Zhang et al. |

* cited by examiner

LOCALIZED STRESS MODULATION BY IMPLANT TO BACK OF WAFER

CROSS-REFERENCE TO RELATED APPLICATIONS

This application claims priority to U.S. provisional patent application Ser. No. 63/179,944, filed Apr. 26, 2021, the entire contents of which is incorporated by reference herein.

FIELD

The disclosure relates to stress control in substrates and, more particularly, to localized stress modulation by implant to a back of the substrate to reduce in-plane distortion.

BACKGROUND

Devices such as integrated circuits, memory devices, and logic devices may be fabricated on a substrate such as a silicon wafer by a combination of deposition processes, etching, ion implantation, annealing, and other processes. Generally, certain requirements are established for the flatness and thickness uniformity of the wafers. However, the various process steps performed during fabrication may alter stresses in the thin films deposited on the wafers and result in elastic deformation that can cause significant distortions, including in-plane distortions (IPD) and/or global distortion. Such distortions may lead to errors in downstream processes. For example, distortions may lead to overlay errors in lithographic patterning or the like.

It is with respect to these and other considerations the present embodiments are provided.

SUMMARY OF THE DISCLOSURE

This Summary is provided to introduce a selection of concepts in a simplified form further described below in the Detailed Description. This Summary is not intended to identify key features or essential features of the claimed subject matter, nor is the summary intended as an aid in determining the scope of the claimed subject matter.

In one embodiment, a method may include providing a substrate, the substrate comprising a first main side opposite a second main side, wherein a plurality of features are disposed on the first main side, and performing a metrology scan to the first main side to determine an amount of distortion to the substrate due to the formation of the plurality of features. The method may further include depositing a stress compensation film along the second main side of the substrate, wherein a stress and a thickness of the stress compensation film are determined based on the amount of distortion to the substrate, and directing ions to the stress compensation film in an ion implant procedure.

In another embodiment, a method may include providing a substrate including a first main side opposite a second main side, wherein a plurality of features are disposed on the first main side, and performing a metrology scan to the first main side to determine an amount of distortion to the substrate due to the formation of the plurality of features. The method may further include depositing a stress compensation film along the second main side of the substrate, wherein a stress and a thickness of the stress compensation film are determined based on the amount of distortion to the substrate, and wherein the stress or the thickness of the stress compensation film varies between two different locations along the second main side. The method may further include directing ions to the stress compensation film in an ion implant procedure.

In another embodiment, an apparatus for substrate stress control may include a beam scanner operable to scan an ion beam with respect to a substrate, and a controller, coupled to the beam scanner, wherein the controller may include a processor and a memory unit coupled to the processor, including a scan routine, the scan routine operative on the processor to performing a metrology scan to a first main side of the substrate to determine an amount of distortion to the substrate due to the formation of a plurality of features along the substrate. The controller may be further operable to cause a stress a stress compensation film to be deposited along a second main side of the substrate, wherein a stress and a thickness of the stress compensation film are determined based on the amount of distortion to the substrate, and direct the ion beam to the stress compensation film.

BRIEF DESCRIPTION OF THE DRAWINGS

The accompanying drawings illustrate exemplary approaches of the disclosure, including the practical application of the principles thereof, as follows.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

The present embodiments will now be described more fully hereinafter with reference to the accompanying drawings, where some embodiments are shown. The subject matter of the present disclosure may be embodied in many different forms and are not to be construed as limited to the embodiments set forth herein. These embodiments are provided so the disclosure will be thorough and complete, and will fully convey the scope of the subject matter to those skilled in the art. In the drawings, like numbers refer to like elements throughout.

The embodiments described herein relate to techniques and an apparatus for improved stress control in a substrate, such as a semiconductor wafer having patterned structures formed therein. The present embodiments may be employed during device fabrication to reduce stress developing during wafer processing, such as device fabrication.

More specifically, the present embodiments may employ an ion beam generated in an ion implanter, such as, but not limited to, scanned spot beams. Various embodiments employ novel ion implantation approaches to alter substrate curvature induced by stress in features formed on the substrate during device processing. The present embodiments may employ novel patterns of implantation into a stress compensation film along the back of the substrate to generate a compensating stress, where the compensating stress may operate to reduce the in-plane distortion along the front side of the substrate.

Figure 1A:
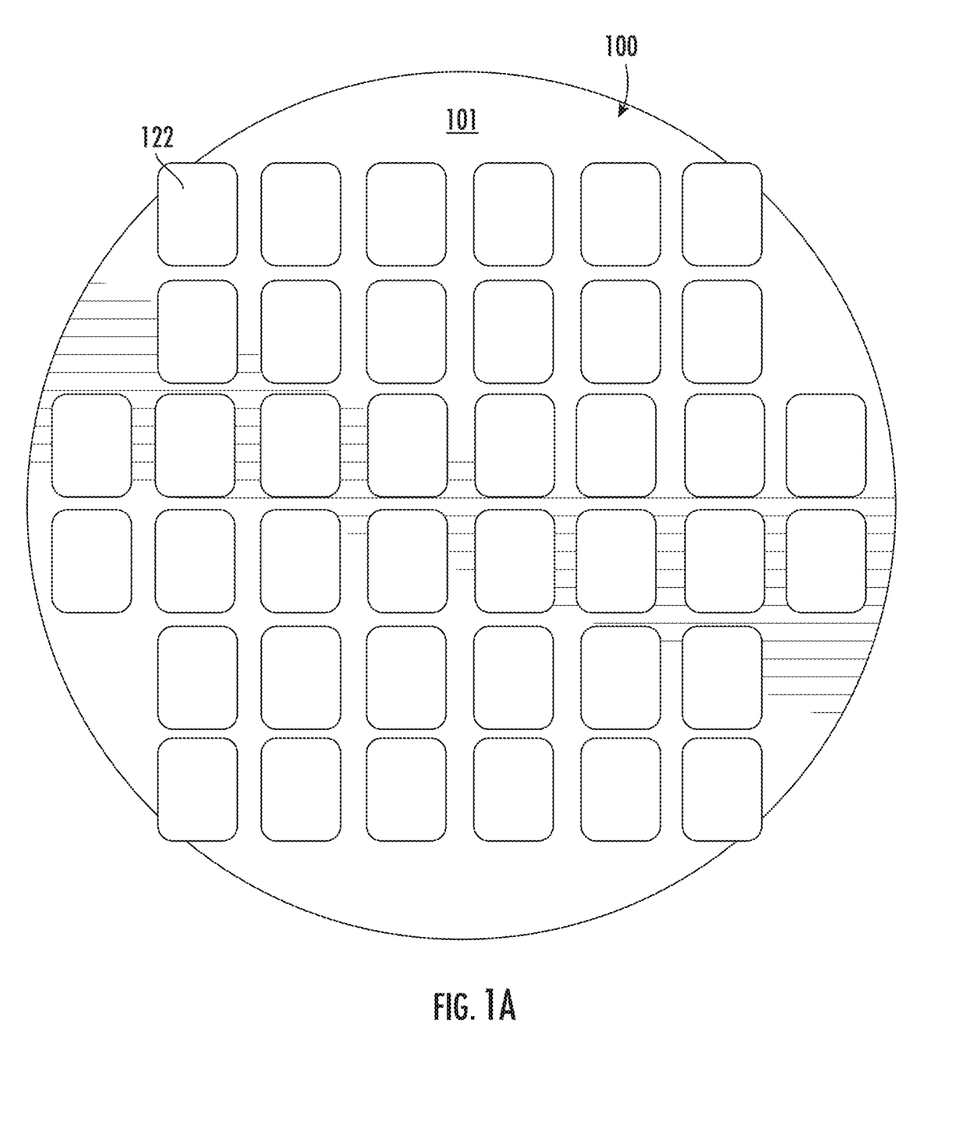
FIG. 1A depicts a top view of a wafer according to embodiments of the present disclosure.
Figure 1B:
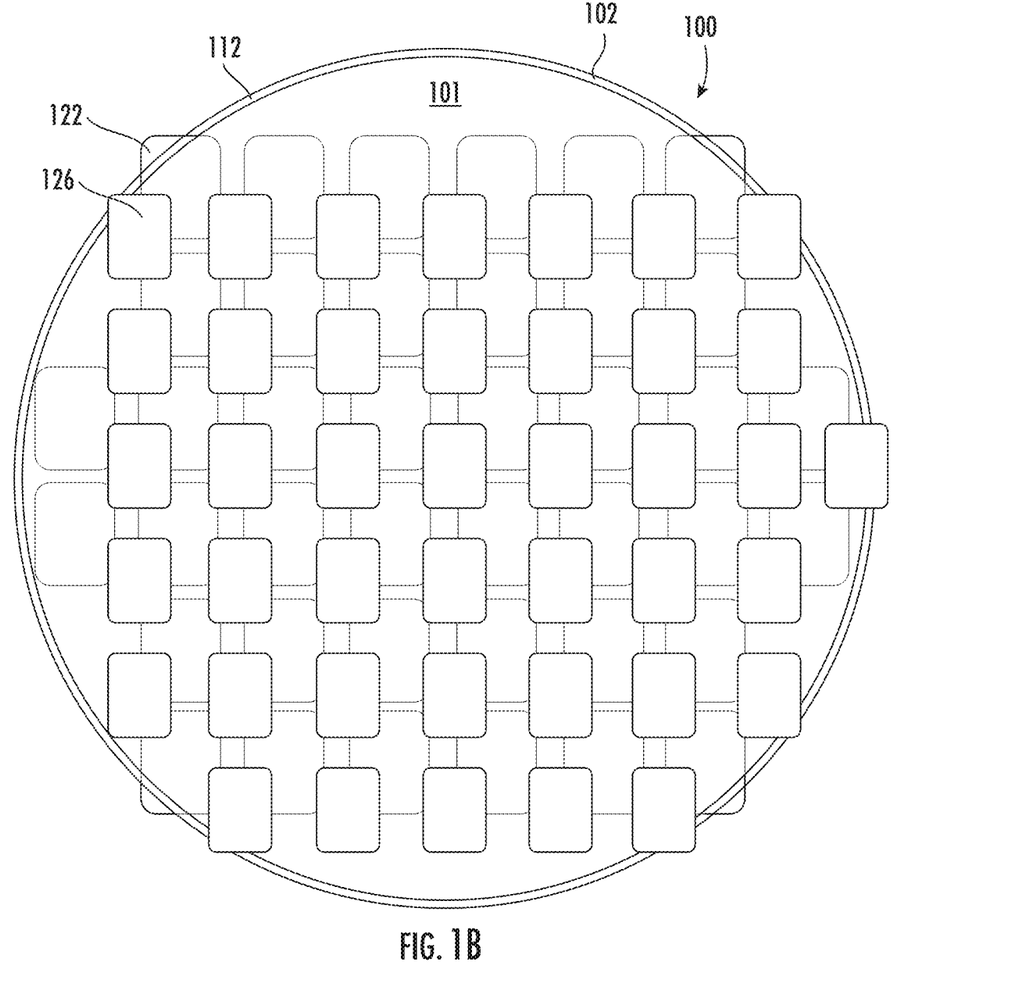
FIG. 1B depicts a bottom view of the wafer according to embodiments of the present disclosure.
Figure 1C:
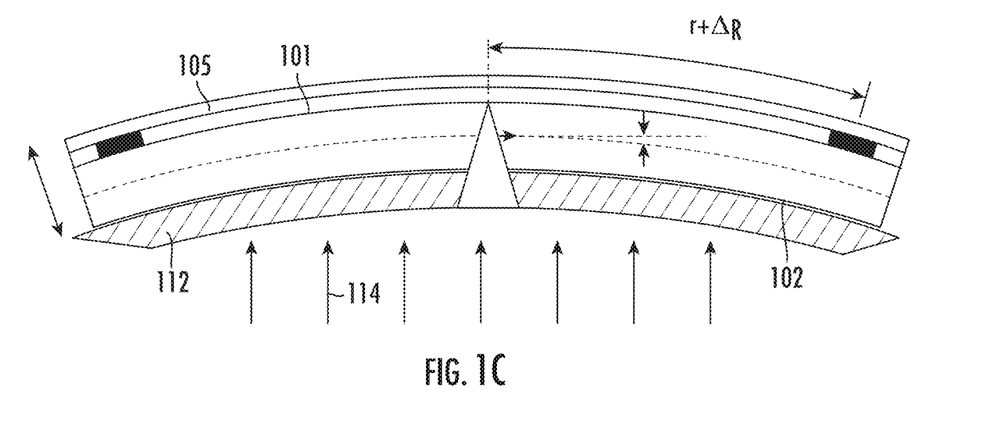
FIG. 1C depicts a side cross-sectional view of the wafer according to embodiments of the present disclosure.

Referring now to FIGS. 1A-1C, top, bottom, and side cross-sectional views of a substrate 100 according to embodiments of the present disclosure will be discussed. Although non-limiting, the substrate 100 may be a wafer for forming 3D NAND devices. As shown, the substrate 100 may include a first main side 101 opposite a second main side 102. The first main side 101 may be a front or top of the substrate, and may include a plurality of features 105 (FIG. 1C), such as layers, devices, semiconductor die (chips), etc., fabricated within surface regions of the substrate 100, as known in the art. In various embodiments, the features 105 may be formed generally in a continuous fashion across the surface of the first main side 101. The features may be isolated from one another, connected to one another through continuous layers, partially connected to one another, isolated from one another along a first direction, while not isolated from one another along a second direction. During fabrication of the features 105, one layer or a plurality of layers (not separately) may be deposited on the substrate 100, where at least one layer may exhibit an intrinsic stress. As more layers are deposited, for example, the intrinsic stress within the layers may tend to increase, resulting in a distortion, deformation, bowing, and/or curvature of the substrate 100.

In accordance with embodiments of the disclosure, distortion of the substrate 100 may be addressed by a combination of deposition and ion implantation. One or more species may be deposited to the second main side 108 of the substrate 100. In various embodiments, the depositing species may be such to form a suitable layer, such as silicon nitride or other material. The embodiments are not limited in this context. The resulting layer is shown as a stress compensation film or layer 112 in FIGS. 1B and 1C.

According to various embodiments, the film 112 may be deposited to an appropriate thickness to generate an adequate compensating stress to adjust the substrate bowing. As is known, the curvature induced by a deposited layer on a substrate, having a given substrate thickness, is proportional to the product of the stress in the film 112 multiplied by the thickness in the film 112. Thus, for a given stress to be imparted into the film 112, the thickness of the film 112 may be locally adjusted to generate a targeted stress-thickness product to produce a targeted change in the bowing of the substrate 100. According to various embodiments, the film 112 may have a thickness of 100 nm to 500 nm. The embodiments are not limited in this context. In accordance with different embodiments, the film 112, as-deposited, may have a neutral stress (zero stress), tensile stress, or compressive stress. In some embodiments, more than one film layer may be present.

In some embodiments, a thickness of the film 112 can be controlled or optimized based on a $1^{st}$ order bow correction information of the substrate 100. For example, a wafer die warp measurement to the first main side 101 of the substrate 100 may be performed, e.g., using any variety of metrology devices, to map a plurality of target areas 122 arranged uniformly across the first main side 101. The plurality of target areas 122 may represent areas of the first main side 101 of the substrate 100 where defects or corrections are desired to address an amount of distortion to the substrate 100, e.g., wafer bowing. When the arrangement is consistent or uniform, the plurality of target areas 122 may be identifiable according to a grid or coordinate system. Stress information from the plurality of target areas 122 along the first main side 101 is used to tune local thickness and stress characteristics of the film 112 along the second main side 102, as will be describe in greater detail below.

As used herein, "depositing" and/or "deposited" may include any now known or later developed techniques appropriate for the material to be deposited including yet not limited to, for example: chemical vapor deposition (CVD), low-pressure CVD (LPCVD), and plasma-enhanced CVD (PECVD). Additional techniques may include semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), and sputtering deposition. Additional techniques may include ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

As shown in FIG. 1C, an ion implantation procedure (e.g., scanned spot or ribbon ion beam implant) is performed, to direct ions 114 into the stress compensation film 112. In the example shown, the ions 114 may be directed to the film 112 in to generate a plurality of local stress patterns 126 (FIG. 1B) in the film 112. The ions 114 may include one or more different species delivered using one or more implant steps. As will be described in greater detail below, the local stress patterns 126 may correspond to a countering stress, which addresses the stress information from the plurality of target areas 122 along the first main side 101 of the substrate. Although non-limiting, the local stress patterns 126 may overlap multiple target areas 122.

According to various embodiments, the ion energy of ions 114 may be tuned to implant ions within an appropriate depth of the film 112, in order to induce an adequate change in stress state. In some examples, the ions 114 may be directed into the film 112 at an energy of 100 keV to 300 keV. The embodiments are not limited in this context.

Figure 2A:
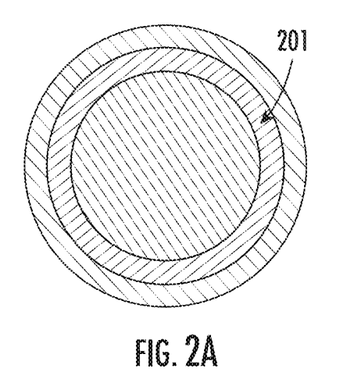
FIGS. 2A-2C demonstrate various compensation pattern topographies according to embodiments of the present disclosure.
Figure 2B:
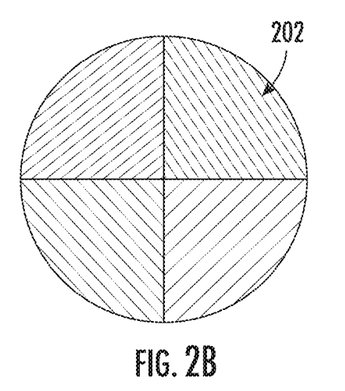
Figure 2C:
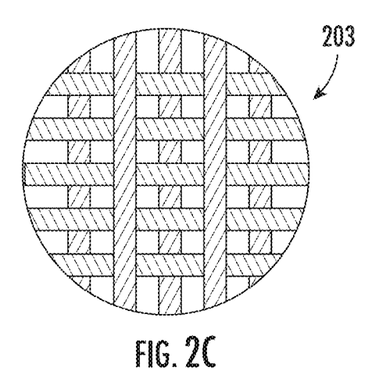
Figure 3:
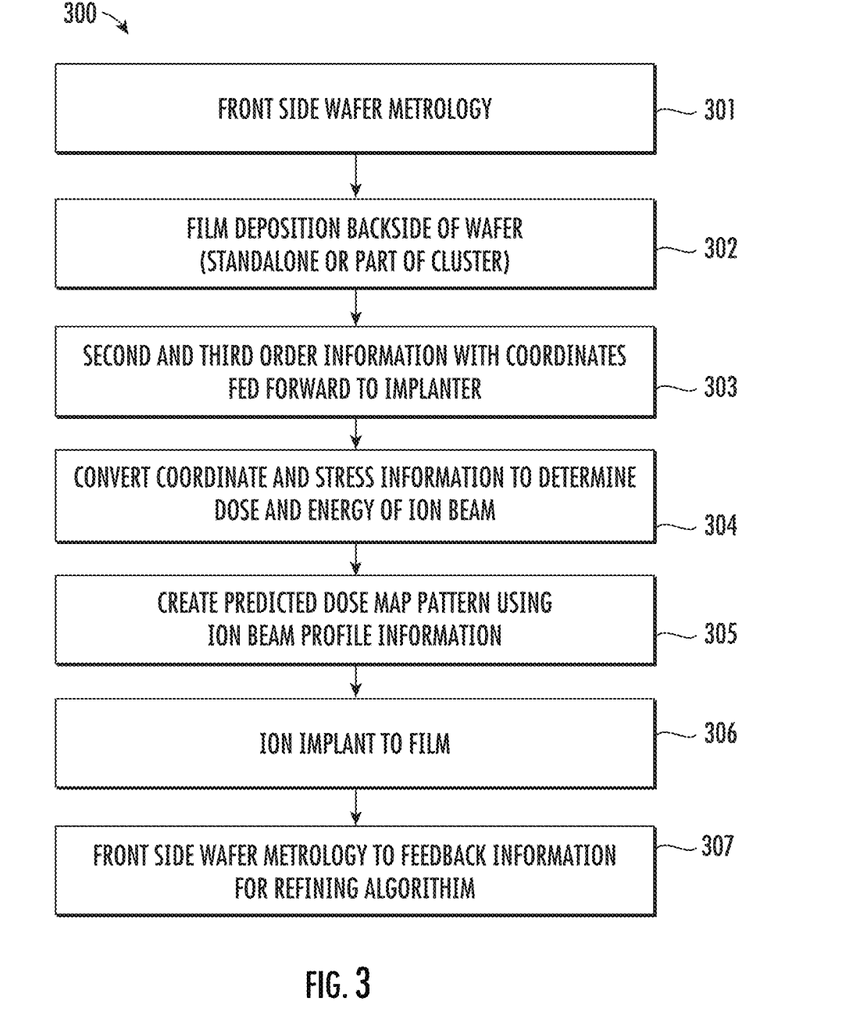
FIG. 3 depicts a process flow in accordance with embodiments of the disclosure.

Referring to FIG. 3, a non-limiting method 300 according to embodiments of the present disclosure will be described. At block 301, the method 300 may include performing a front side wafer metrology. In some embodiments, the metrology may include a process to parse and filter out various orders of topography, such as the first $1^{st}$ order topography 201 demonstrated in FIG. 2A, the $2^{nd}$ order topography 202 demonstrated in FIG. 2B, and the $3^{rd}$ order topography 203 demonstrated in FIG. 2C. In one example, the $1^{st}$ order bow correction information may be used to determine stress/thickness of the film 112.

At block 302, the method 300 may include deposition of the film 112 to the second main side 102 of the substrate, as described above. At block 303, the method 300 may include correlating the $2^{nd}$ and $3^{rd}$ order topography information with coordinates of the plurality of target areas 122, and providing the information to an implanter.

At block 304, the method may include converting coordinate and stress information to determine dose and energy of the ions 114 of the ion implant procedure. In some embodiments, the information may be used for stress correction based on a stress calibration input coupled with an algorithm that will map the stress pattern to the targeted implanter dose map pattern in x and y or circular coordinates. At block 305, the method 300 may include creating a predicted dose map pattern using ion beam profile information, which is based on the determined dose and energy of the ions 114, as well as other recipe information. In some embodiments, a graph may be created using a beam profiler operable to measure certain parameters associated with the ion beam, such as beam current as a function of position. Although non-limiting, the beam profiler may comprise one or more Faraday devices arranged in a linear manner. In another embodiment, the beam profile may be measured by a plurality of Faraday devices arranged in a two-dimensional array. The Faraday devices collect current and the beam profiler is able to measure an amount of current collected by each Faraday device. A controller may take the information from the beam profiler and generate a desired implant pattern. This desired implant pattern may be stored in the non-transitory storage element as a two-dimensional array, where the value of each element in the array represents the desired dose at that particular position.

At block 306, the ion implant is performed to the film 112. In some embodiments, the ion implant occurs using both horizontal and vertical scanning of the substrate 100. Although non-limiting, the scanning is performed according to the desired implant pattern, and can be a combination of electrostatic or magnetic and mechanical.

At block 307, a second metrology operation may then be performed to the front of substrate to further refine the algorithm and start the process over again.

Figure 4A:
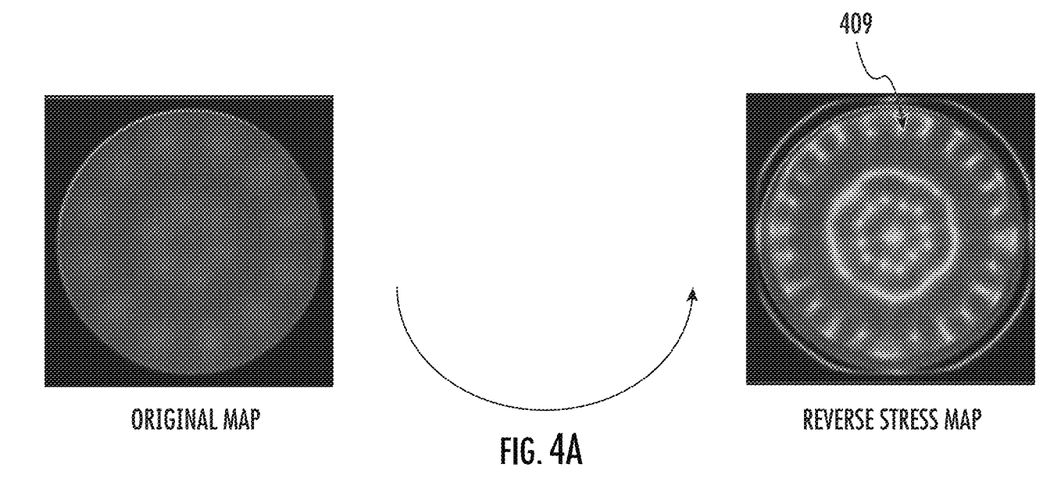
FIG. 4A demonstrates an original and a modified stress map on opposite sides of a substrate according to embodiments of the present disclosure.
Figure 4B:
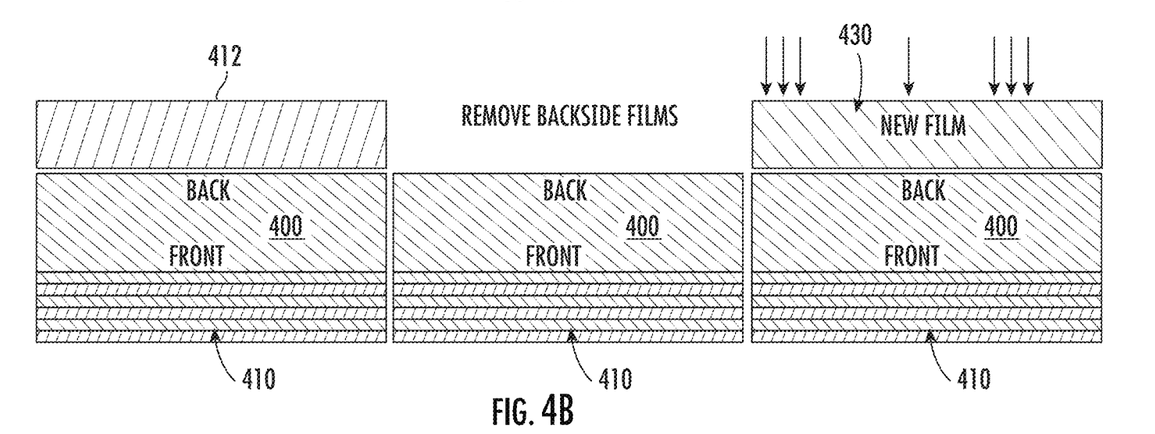
FIG. 4B demonstrates an approach for forming an additional film on a backside of a substrate according to embodiments of the present disclosure.

FIG. 4A demonstrates an original map 408 on a first side of a substrate 400 and a modified/reverse stress map 409 on the second main side of the substrate 400. As shown in FIG. 4B, in this embodiments, the process may include providing one or more front 410 and backside wafer films 412 formed on opposite sides of the substrate 400. The backside film(s) 412 may be removed and a second film 430 may be formed along the backside of the substrate 400. In some embodiments, the second film 430 may include multiple layers.

Figure 5A:
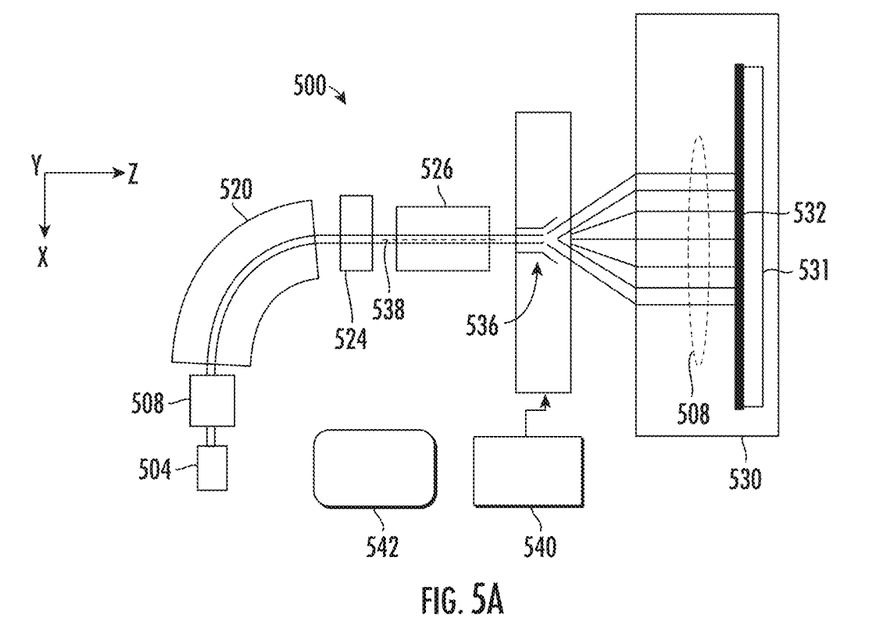
FIGS. 5A-5B depict different representations of an ion implanter, consistent with various embodiments of the disclosure.

FIG. 5A depicts a schematic top view of an ion implantation system for stress control in accordance with embodiments of the disclosure. The ion implantation system, also referred to as ion implanter 500, represents a process chamber containing, among other components, an ion source 504 for producing an ion beam 508, and a series of beam-line components. The ion source 504 may comprise a chamber for receiving a flow of gas and generating ions. The ion source 504 may also comprise a power source and an extraction electrode assembly (not shown) disposed near the chamber. The beam-line components may include, for example, an analyzer magnet 520, a mass resolving slit (MRS) 524, a steering/focusing component 526, and end station 530, including substrate holder 531. Although the ion implanter 500 described herein is a medium-current (MC) ion implanter, it will be appreciated that a high-current (HC) ion implanter may also be used in alternative embodiments.

The ion implanter 500 further includes a beam scanner 536 positioned along a beamline 538 between the MRS 524 and the end station 530. The beam scanner 536 may be arranged to receive the ion beam 508 as a spot beam and to scan the ion beam 508 along a fast scan direction, such as parallel to the X-Axis in the Cartesian coordinate system shown. Notably, the substrate 532 may be scanned along the Y-axis, so a given ion treatment may be applied to a given region of the substrate 532 as the ion beam 508 is simultaneously scanned back and forth along the X-axis. The ion implanter 500 may have further components, such as a collimator as known in the art (not shown for clarity), to direct ions of the ion beam 508, after scanning, along a series of mutually parallel trajectories to the substrate 532, as suggested in FIG. 5A. In various embodiments, the ion beam 508 may be scanned at a frequency of several Hz, 10 Hz, 100 Hz, up to several thousand Hz, or greater. For example, the beam scanner 536 may scan the ion beam 508 using magnetic or electrostatic scan elements, as known in the art.

By scanning the ion beam 508 rapidly over a fast scan direction, such as back and forth over along the X-axis, the ion beam 508, configured as a spot beam, may deliver a targeted ion dose of uniform density across a substrate 532. In accordance with various embodiments, the ion beam 508 may be controlled, responsive to user input, to generate a target implant pattern by a combination of scanning of the substrate 532 in conjunction with scanning of the ion beam 508.

For example, the ion implanter 500 may further include a controller 540, coupled to the beam scanner 536, to coordinate operation of the beam scanner 536 and substrate stage 531. As further shown in FIG. 5A, the ion implanter 500 may include a user interface 542, also coupled to the controller 540. The user interface 542 may be embodied as a display, and may include user selection devices, including touch screens, displayed menus, buttons, knobs, and other devices as known in the art. According to various embodiments, the user interface 542 may send instructions to the controller 540 to generate an appropriate implant pattern for the substrate 532, according to the user input.

Figure 5B:
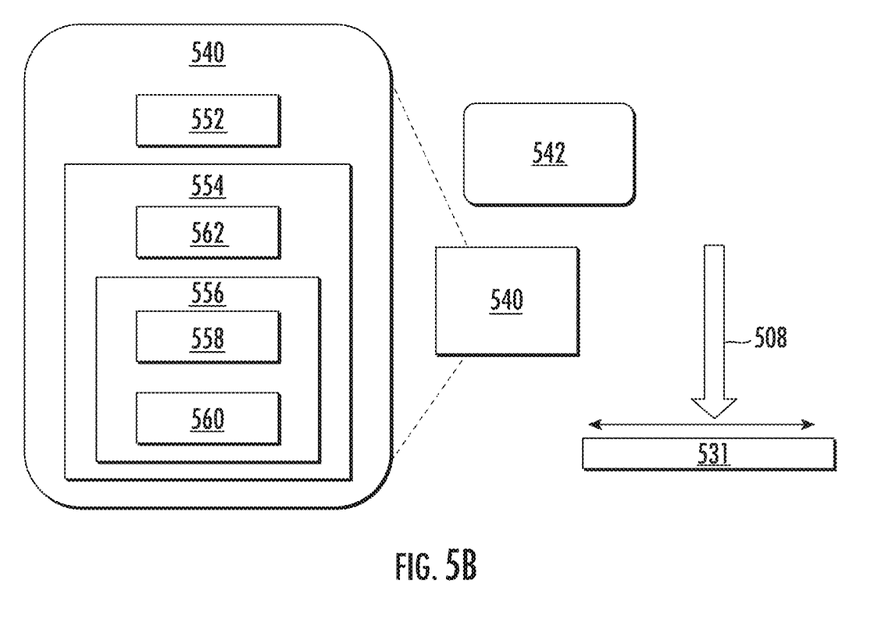

As further shown in FIG. 5B, the controller 540 may include a processor 552, such as a known type of microprocessor, dedicated processor chip, general purpose processor chip, or similar device. The controller 540 may further include a memory or memory unit 554, coupled to the processor 552, where the memory unit 554 contains a scan routine 556. The scan routine 556 may be operative on the processor 552 to manage scanning of the ion beam 508 and substrate 532 as described below. The memory unit 554 may comprise an article of manufacture. In one embodiment, the memory unit 554 may comprise any non-transitory computer readable medium or machine readable medium, such as an optical, magnetic or semiconductor storage. The storage medium may store various types of computer executable instructions to implement one or more of logic flows described herein. Examples of a computer readable or machine-readable storage medium may include any tangible media capable of storing electronic data, including volatile memory or non-volatile memory, removable or non-removable memory, erasable or non-erasable memory, writeable or re-writeable memory, and so forth. Examples of computer executable instructions may include any suitable type of code, such as source code, compiled code, interpreted code, executable code, static code, dynamic code, object-oriented code, visual code, and the like. The embodiments are not limited in this context.

In particular embodiments, the scan routine 556 may include an implant pattern processor 558 and scan control processor 560. The implant pattern processor 558 may receive a set of substrate stress information, such as from host interface 542, indicative of the stress state in a substrate 532. The substrate stress information may include substrate thickness, stress compensation film thickness, curvature of the substrate, and so forth. The implant pattern processor 558 may use the substrate stress information to calculate an appropriate implant pattern information to counter the curvature of the substrate. The implant pattern information may include ion dose, ion species, and size of implant stripes as generally discussed above. In various embodiments, a series of implant patterns may be stored in a database 562, where the different implant patterns may be correlated to different levels of curvature in a substrate. The scan control processor 560 may control scanning of the substrate 532, as well as scanning of the ion beam 508 to implement the implant pattern in the substrate 532. Thus, in various embodiments, the treatment of the substrate using an implant pattern to generate anisotropic stress in a stress control layer may be automated, or partially automated.

Figure 6:
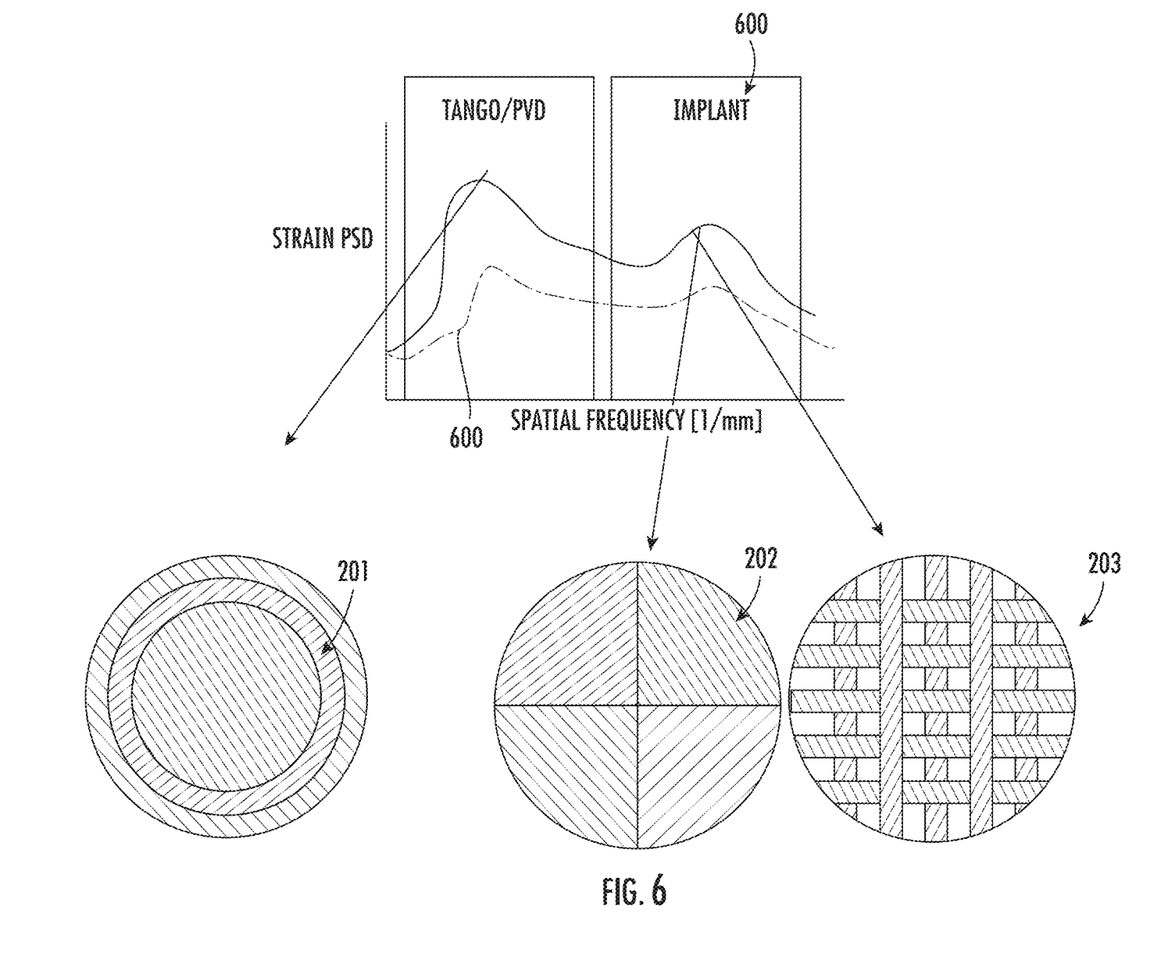
FIG. 6 demonstrate in-plane distortion correction according to embodiments of the present disclosure.

FIG. 6 demonstrates in-plane distortion correction as a result of the embodiments of the present disclosure. The different orders of inherent topography (201, 202, 203) in the wafer are represented in graph 600. The higher wavelength (lower frequency) is represented by the initial stress in the wafer. Curve 601 below that represents the correction after the backside film 112 has been deposited. The lower wavelength (higher frequency) is represented by the orders of stress that are to be corrected by the mapped implant. The curve 601 below that represents the stress reduction after the implant.

Figure 7A:
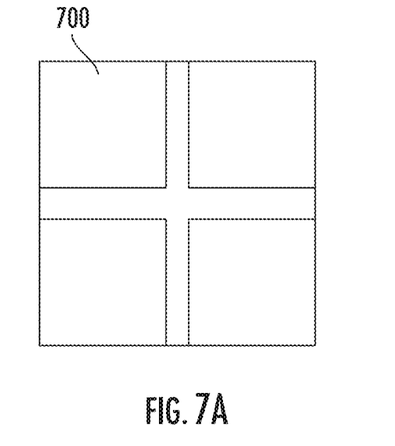
FIGS. 7A-7B demonstrate front and back views of a substrate including multiple overlapping implants performed to a backside of the substrate, according to embodiments of the present disclosure.
Figure 7B:
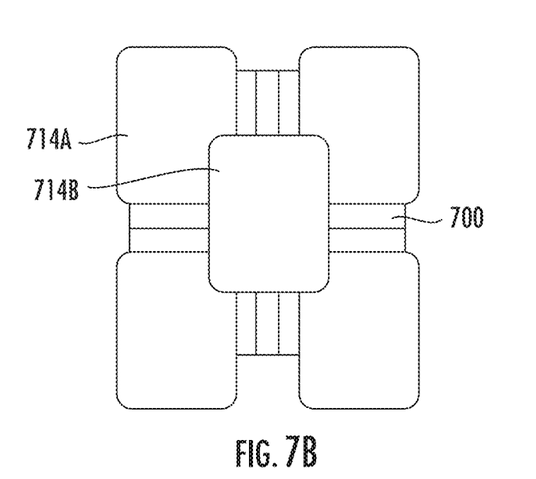

FIGS. 7A-7B demonstrate front and back views of a substrate 700, respectively, wherein multiple overlapping implants 714A, 714B may be performed to the backside of the substrate 700.

The foregoing discussion has been presented for purposes of illustration and description and is not intended to limit the disclosure to the form or forms disclosed herein. For example, various features of the disclosure may be grouped together in one or more aspects, embodiments, or configurations for the purpose of streamlining the disclosure. However, it should be understood that various features of the certain aspects, embodiments, or configurations of the disclosure may be combined in alternate aspects, embodiments, or configurations. Moreover, the following claims are hereby incorporated into this Detailed Description by this reference, with each claim standing on its own as a separate embodiment of the present disclosure.

What is claimed is:

1. A method, comprising:
   providing a substrate, the substrate comprising a first main side opposite a second main side, wherein a plurality of film layers are disposed on the first main side and the second main side;
   performing a metrology scan to determine an amount of distortion to the substrate due to formation of the plurality of film layers;
   removing the plurality of film layers from the second main side of the substrate;
   depositing a stress compensation film along the second main side of the substrate, wherein a stress and a thickness of the stress compensation film are determined based on the amount of distortion to the substrate, and wherein the thickness varies across the stress compensation film; and
   directing ions to the stress compensation film in an ion implant procedure.

2. The method of claim 1, wherein the metrology scan generates a topography map of the first main side of the substrate, and wherein the topography map is characterized by a plurality of coordinates and stress information correlated to each of the plurality of coordinates.

3. The method of claim 2, further comprising modifying, based on the stress information, a dose and an energy of the ions directed to the stress compensation film.

4. The method of claim 1, wherein the amount of distortion to the substrate is calculated based on first order bow correction information.

5. The method of claim 1, further comprising forming a second stress compensation film over the stress compensation film.

6. The method of claim 1, wherein the implant procedure comprises scanning a spot beam or a ribbon beam across the stress compensation film along a first direction and a second direction.

7. The method of claim 1, further comprising performing a second metrology scan to the first main side to determine a change in the amount of distortion to the substrate.

8. A method, comprising:
   providing a substrate including a first main side opposite a second main side, wherein a plurality of film layers are disposed on the first main side and the second main side;
   performing a metrology scan to the first main side to determine an amount of distortion to the substrate due to formation of the plurality of film layers;
   removing the plurality of film layers from the second main side of the substrate;
   depositing a stress compensation film along the second main side of the substrate, wherein a stress and a thickness of the stress compensation film are determined based on the amount of distortion to the substrate, and wherein the stress or the thickness of the stress compensation film varies between two different locations along the second main side; and
   directing ions to the stress compensation film in an ion implant procedure.

9. The method of claim 8, wherein the metrology scan generates a topography map of the first main side of the substrate, and wherein the topography map is characterized by a plurality of coordinates and stress information correlated to each of the plurality of coordinates.

10. The method of claim 9, further comprising modifying, based on the stress information and the thickness of the stress compensation film, a dose and an energy of the ions directed to the stress compensation film.

11. The method of claim 8, wherein the amount of distortion to the substrate is calculated based on first order bow correction information.

12. The method of claim 8, further comprising forming a second stress compensation film over the stress compensation film.

13. The method of claim 8, wherein the ion implant procedure comprises scanning a spot beam or a ribbon beam across the stress compensation film along a first direction and a second direction.

14. The method of claim 8, further comprising performing a second metrology scan to the first main side to determine a change in the amount of distortion to the substrate.

\* \* \* \* \*